United States Patent
Burns et al.

(10) Patent No.: US 7,892,705 B2
(45) Date of Patent: Feb. 22, 2011

(54) PHOTOMASK AND METHOD OF MAKING THEREOF

(75) Inventors: Sean D. Burns, Hopewell Junction, NY (US); Michael M. Crouse, Albany, NY (US); Dario L. Goldfarb, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 655 days.

(21) Appl. No.: 11/865,982

(22) Filed: Oct. 2, 2007

(65) Prior Publication Data

US 2009/0087755 A1    Apr. 2, 2009

(51) Int. Cl.
*G03F 1/00* (2006.01)

(52) U.S. Cl. .................. 430/5; 430/270.1; 430/394

(58) Field of Classification Search .............. 430/5, 430/270.1; 359/883; 355/77
See application file for complete search history.

(56) References Cited

U.S. PATENT DOCUMENTS

| | | | |
|---|---|---|---|
| 4,336,316 A * | 6/1982 | Sato | 430/5 |
| 6,436,605 B1 * | 8/2002 | Angelopoulos et al. | 430/270.1 |
| 2004/0196447 A1 * | 10/2004 | Watanabe | 355/77 |
| 2004/0196579 A1 * | 10/2004 | Shoki | 359/883 |
| 2007/0224523 A1 * | 9/2007 | Huh et al. | 430/5 |

* cited by examiner

*Primary Examiner*—Mark F Huff
*Assistant Examiner*—Rashid Alam
(74) *Attorney, Agent, or Firm*—Connolly Bove Lodge & Hutz LLP; Daniel P. Morris

(57) ABSTRACT

The disclosure is related to photomasks used in photolithography and methods of making photomasks. The method involves providing a transparent substrate with one or more reflective films disposed over a surface of the substrate, applying a photoresist to the solution-contacted reflective film and forming a pattern in the photoresist that is transferred to the substrate, and developing the pattern on the substrate by removing the remaining portions of the photoresist. The substrate carrying the patterned reflective film is then contacted with a solution comprising oxyanions. The disclosure is also related to photomasks made using the disclosed method.

13 Claims, No Drawings

PHOTOMASK AND METHOD OF MAKING THEREOF

FIELD OF THE DISCLOSURE

The disclosure is related to photomasks used in photolithography and methods of making photomasks. The disclosure also relates to the use of a solution containing oxyanions in the manufacture of a photomask for use in photolithography.

BACKGROUND OF THE DISCLOSURE

Integrated circuits are manufactured using photolithographic processes that direct light through a transparent photomask, also known as a reticle, to project a circuit image onto a silicon wafer. However, the process to make the photomask often results in the formation of defect seeds in the finished photomask which can lead to delayed and amplified interference during the patterning process. These defect seeds can grow with time in a fab environment due to the presence of airborne impurities and its potential reaction with the photomask surface, in the presence of activating mechanisms such as ultraviolet (UV) radiation. If the physical size of the defect exceeds the critical resolution, then the defect will cause undesirable image (pattern) transfer to the wafer. The quality of the integrated circuits thus produced may be adversely affected by any seed defects present in the mask. Because seed defects are not uncommon in the masks, these defects must be reduced or eliminated before using the mask in a production process.

The conventional method of cleaning a photomask has employed a cleaning method based on RCA cleaning (cleaning with a mixture of an acid such as sulfuric acid and hydrogen peroxide), which is also widely used for cleaning wafers. Typically, in a first step, cleaning is effected with a hot mixture of sulfuric acid and hydrogen peroxide to decompose organic objects such as resist and residual solvent present on the surface of a photomask and remove metallic impurities. This step provides the surface of the photomask with an improved wettability that enhances the efficiency of the subsequent cleaning steps. See U.S. Pat. No. 6,494,966 assigned to International Business Machines Corporation, which describes the use of acidic wash/rinse solutions to clean photomasks.

In a second step, the photomask is rinsed with hot pure water to displace the sulfuric acid cleaning agent from the surface thereof. Next, in a third step, the photomask is dipped in and cleaned with aqueous ammonia for the purpose of neutralizing residual sulfuric acid and removing attached foreign objects. During this step, ultrasonic waves can be applied to the dipping tank to facilitate the removal of foreign objects. During the cleaning, rinsing and drying steps, it is often preferred to contact the photomask surface with electrolytic solutions, such as those comprised of weak or strong acids or bases, such as aqueous sulfuric acid, aqueous ammonia or carbonated water, in order to avoid electrostatic discharge (ESD) due to static charge build-up, which can arise from shear liquid flow over the substrate surface when using highly resistive rinse fluids such as deionized water, as described in U.S. Pat. No. 4,569,695. It is known to those skilled in the art that ESD can create melt, distort, bridge or cut the reflective patterns created on the photomask substrate, therefore degrading the quality of the finished photomask (see U.S. Pat. No. 6,596,552).

Alternatively, the third step can involve cleaning with pure deionized water or mixed with a detergent, and optionally in an ultrasonic bath. The photomask can be eventually rinsed with pure deionized water as a forth step and then dried in a fifth step. The combined use of ionizing bars over a photomask rinse tank with pure deionized water can also prevent the occurrence of ESC (A. Steinman, *Semiconductor Manufacturing* 21 (1994) 179). Yet another method to rinse photomasks consists on the use of electrolyzed water, also known as 'anodic' water or 'cathodic' water to those skilled in the art (see U.S. Pat. No. 6,277,205).

Aqueous sulfuric acid used in conjunction with hydrogen peroxide as a photomask cleaning agent leads to strong adsorption of sulfate ions to chrome oxide ($Cr_2O_3$), such as the $Cr_2O_3$ layer naturally present on the surface of the Chrome (Cr) structures that compose the pattern layout of a photomask. The adsorption of sulfate-containing salts to chrome oxide and its dependence on pH has been studied in detail (G. Horanyi et al., *J. Solid State Electrochem.* 6 (2002) 485). Similar adsorption behavior is expected from the contact of sulfuric acid cleaning solution with quartz substrates. Furthermore, the surface neutralization reaction between residual sulfuric acid and aqueous ammonia results in potential incomplete displacement of sulfate ions from the reticle surface due to the adsorption process. Instead, formation of ammonium sulfate crystal seeds that remain present on the chrome or quartz surface during actual use and storage of the reticle in a fab environment is verified (K. Bhattacharyya et al., *Proc. SPIE* 4889 (2002) 478). During the lifetime of a reticle in a semiconductor manufacturing environment the mask surface is exposed to a variety of airborne contaminants, originating from the mask making materials, reticle containers and fab or scanner environment, such as outgassed products from the pellicle adhesive, gaseous ammonia and nitrous oxide generated during semiconductor fabrication processes and environmental carbon dioxide (E. Johnstone et al., *Solid State Technology*, May 2004). The reaction of such airborne contaminants with the ammonium sulfate defect seeds originated from the mask manufacturing process and present on the reticle surface result in the growth of such defects over time. This growth can even be assisted and accelerated by UV light, such as 193 nm or 248 nm imaging radiation used in photolithographic processes (J. Flicstein et al. *Applied Surface Science* 138 (1999) 394). The critical size beyond which a defect grown on the reticle surface becomes a printable killer defect on the wafer depends on the location and proximity of the defect with respect to intra-level and inter-level functional features within the chip layout.

To remove relatively large physical defects from a photomask, the industry often relies upon detection of the defect followed by laser ablation (see U.S. Pat. No. 6,593,040). Unfortunately, the size and shape of ammonium sulfate defect seeds created on the reticle surface is smaller than the resolution limit of the reticle inspection tools used to qualify the photomasks during the manufacturing process.

An alternative method that is commonly practiced to remove organic contaminants is described in U.S. Pat. No. 6,387,602. The procedure consists on using ultraviolet light in an oxygen environment (photo-oxidation) to remove trace organic objects that can remain on a surface of a photomask during fabrication and storage at the IC fabrication facility. This method results highly inefficient for the removal of ammonium sulfate defect seeds due to the inorganic nature of such impurities.

SUMMARY OF THE DISCLOSURE

The disclosure involves a process for making a photomask for use in photolithography. The process involves providing a transparent substrate with one or more reflective films disposed over a surface of the substrate, applying a photoresist to the solution-contacted reflective film and forming a pattern in the photoresist that is transferred to the substrate. The pattern on the substrate is then developed and cleaned by removing the remaining portions of the photoresist. The patterned substrate is then contacted with a highly diluted ionic solution comprising selective oxyanions and dried. The oxyanions remain on the pattern surface, arresting the growth of seed defects during the lifetime of the reticle in a semiconductor manufacturing environment.

DETAILED DESCRIPTION OF THE DISCLOSURE

The steps of cleaning a photomask to remove unwanted photoresist and unwanted chemical agents as discussed above often results in the presence of defects in the form of ammonium sulfate particles or crystallites. See. H. Handa et al., *Photomask and Next-Generation Lithography Mask Technology VIII*, Proceedings of SPIE Vol. 4409 (2001). The source of sulfate ion is the sulfuric acid, and the source of ammonium ion is the ammonia that is used in the cleaning and rinsing solutions. Often the ammonium sulfate particles or crystallites, which we can refer to as defects, grow to a size that exceeds 0.5 microns during the lifetime of the reticle in a semiconductor manufacturing environment, and could grow to as large as 1.0 microns or more (A. Zibold et al. *Proc. SPIE* 5567 (2005) 118). If these relatively large defects form on the transparent regions of the photomask, the defects will cause undesired defects in the photoexposed photoresist in subsequent photolithographic processing of the semiconductor integrated circuit. For example, portions of the photoresist would not be exposed due to the unwanted presence of these large defects in the photomask.

The disclosure is directed to a process for making a photomask for use in photolithography. The process comprises providing a transparent substrate with one or more reflective films disposed over a surface of the substrate. A photoresist is then applied to the reflective film, and a pattern is formed in the photoresist, which is then transferred to the substrate. It is understood that the step of applying the photoresist to the reflective film followed by the patterning of the photoresist and the etching of the exposed reflective film is well known in the art. The patterned photoresist is then stripped by removing the remaining portions of the photoresist, and thereby transferring the pattern of the photoresist to the transparent substrate. The stripping steps are well known by those of ordinary skill in the art. Following the reticle substrate patterning, the patterned reticle substrate is contacted with a solution comprising anions selected from the group consisting of sulfate ($SO_4^{2-}$), hydrogen sulfate ($HSO_4^-$), sulfite ($SO_3^{2-}$), nitrate ($NO_3^-$), nitrite ($NO_2^-$), acetate ($CH_3COO^-$), lactate ($CH_3CH(OH)COO^-$), carbonate ($CO_3^{2-}$), hydrogen carbonate ($HCO_3^-$) and any combination thereof.

The Applicants discovered that by contacting the reflective film with a solution comprising anions selected from sulfate, hydrogen sulfate, sulfite, nitrate, nitrite, acetate, lactate, carbonate, hydrogen carbonate and any combination thereof, and cations selected from sodium, potassium, calcium, magnesium or aluminum and any combination thereof, defect seed nucleation and growth is inhibited, therefore obtaining a photomask with extended lifetime in a semiconductor fabrication environment.

It is noted that the ammonium sulfate crystal growth inhibiting and retarding effect on a quartz substrate introduced by the presence of such purposely added ionic impurities, is based on mechanisms similar to those described for the crystallization kinetics of ammonium sulfate from saturated solutions described in the literature (M. Rauls et al. *Journal of Crystal Growth* 213 (2000) 116).

Prior to Applicants' discovery the use of traditional developing chemicals and rinse chemicals during the process of patterning a transparent substrate for use as a photomask resulted in the formation of a number of relatively large defects over time, that is greater than 300 nm, typically greater than 200 nm, in the transparent regions of the photomask. As stated, such defects can cause undesirable image (pattern) transfer to the wafer. The quality of the integrated circuits thus produced may be adversely affected by these defects present in the photomask. Consequently, secondary efforts are necessary to detect and remove these defects before using the mask in a photolithographic process. Inhibition of the growth of such defects over time is an alternative way to enhance the quality of the finished photomask, as described in the present invention.

In one embodiment, the reflective film is contacted with a solution comprising sulfate anions. The sulfate anions can be added with any common cation, for example, Group IA cations such as sodium ($Na^+$) or potassium ($K^+$), Group IIA cations such as calcium ($Ca^{2+}$) or magnesium ($Mg^{2+}$) and Group IIIA such as aluminum ($Al^{3+}$). The contact of the reflective film with an aqueous solution comprising aluminum sulfate is one of the typical solutions that can be used in the process.

The concentration of the anions in the solution used to contact the reflective film is from 0.1 ppb to 1 ppm, from 0.1 ppb to 100 ppm, or from 0.1 ppb to 10000 ppm. For example, in one embodiment the contacting solution used in the process comprises aluminum sulfate at a concentration from 0.1 ppb to 1 ppm, or from 1 ppm to 10000 ppm.

In one embodiment, the transparent substrate is formed from a quartz (silica glass) ingot in a conventional manner, shaping and annealing the ingot, slicing the ingot into slices, effecting rough polishing on the slices, then effecting precision polishing that determines the final surface quality of the quartz substrate. In the precision polishing step, abrasive cloth and polishing compound are selected so as to give a desired finish surface. This is followed by cleaning, drying and etching.

Any desired chemical may be used for the etching treatment of the finish surface as long as it is reactive with quartz. The preferred chemicals include fluoride ion-containing compounds such as concentrated hydrofluoric acid, diluted hydrofluoric acid and buffered hydrofluoric acid. The chemical solution can contain a surfactant and a reaction control reagent. The chemical solution is preferably used under such conditions that uniform etching proceeds at an appropriate rate.

One process of preparing a quartz substrate for use in the process is described in U.S. Pat. No. 6,928,837, the entire disclosure of which is incorporated herein by reference.

Following the preparation of the transparent substrate, the reflective film is applied using general techniques known to those of ordinary skill in the art. Any type of reflective (hardmask) film can be used in the process. One of the more preferred reflective films is a film based on chromium.

In one embodiment, a chrome oxide (e.g. $Cr_2O_3$, $Cr_2O_5$ or $Cr_2O_7$) film is formed on the transparent substrate by sputter deposition from a $Cr_xO_y$ source or by use of an enriched or O2 plasma. Alternately, the chrome oxide film can be formed by vacuum evaporation utilizing $Cr_xO_y$ as a source material or by vacuum evaporation in which chromium is evaporated in a vacuum in the presence of oxygen. A conventional chromium evaporator can be used with an oxygen bleed valve for admission operating pressures. The operation is controlled so that the thickness of the chrome oxide film is from 1000 Å to about 1200 Å, corresponding to a reflectance of about 27% to about 39%.

The chrome oxide film is subsequently overcoated with a chromium metal film which can be deposited in the same vacuum evaporation unit with the bleed valve closed and the unit purged. Alternately, the chromium metal film can be formed by sputter deposition. The chromium metal film can be deposited to a thickness of about 50 Å to about 100 Å, corresponding to a reflectance of about 50 to about 65%. These composite chromium/chrome oxide films can provide a total reflectance of about 27 to about 39%, and an optical density of at least 3.0 (which is approximately 0.01 transmittance), which will prevent the passage of UV light.

Following the application of the one or more reflective films, the reflective film is then covered with a blanket layer of a standard resist material using any well known process, such as spin coating, dip coating, roller coating, spray coating and the like. Any positive or negative resists known in the art can be used in the process.

The pattern of openings is formed in the resist layer by conventional exposure and development techniques such as UV, x-ray and electron beam lithographic techniques. The resist mask is used for removal of the exposed reflective film(s), e.g., the chromium/chromide oxide composite film described above. The exposed reflective film(s) can be removed by chemical etching, sputter etching, plasma etching, reactive ion etching or other suitable means to provide the transparent regions of the photomask.

The etched photomask is cleaned or finished by several wash and rinse steps to remove any remaining portions of photoresist. For example, a hot mixture of sulfuric acid and hydrogen peroxide can be used to decompose organic objects such as resist and residual solvent present on the surface of a photomask and remove metallic impurities. The photomask can be rinsed with hot pure water to remove residual agents such as sulfuric acid from the surface thereof and/or the photomask can be dipped in and cleaned with a solution containing of ammonia.

The patterned reflective film and quartz substrate of the finished photomask is then contacted with a solution comprising anions selected from sulfate, hydrogen sulfate, sulfite, nitrate, nitrite, acetate, lactate, carbonate, hydrogen carbonate and any combination thereof, and subsequently spin-dried, so as to purposely deposit a controllable concentration of non-printable impurities on the reticle surface, which act as defect growth arrestors during the lifetime of the reticle in a semiconductor manufacturing environment.

The disclosure is also directed to a photomask having little or no detectable defects resulting from the aggregating or crystallizing effect of purposely added ionic impurities on the transparent regions of the substrate. The photomask comprises a patterned reflective film disposed on a surface of a transparent substrate such that light can be transmitted through transparent surface regions of the substrate not in contact with the reflective film. The resulting transparent surface regions include dispersed anionic impurities of $SO_4^{2-}$, $HSO_4^-$, $SO_3^{2-}$, $NO_3^-$, $NO_2^-$, $CH_3COO^-$, $CH_3CH(OH)COO^-$, $CO_3^{2-}$, $HCO_3^-$ and any combination thereof The resulting transparent surface regions also include dispersed cationic impurities such as $Na^+$, $K^+$, $Ca^{2+}$, $Mg^{2+}$, $Al^{3+}$, and any combination thereof.

In one embodiment, the photomask comprises a patterned reflective film disposed on a surface of a transparent substrate such that light can be transmitted through transparent surface regions of the substrate not in contact with the reflective film. The transparent surface regions include purposely added dispersed ionic impurities, and 95% by weight of the ionic impurities have a defect diameter of less than 100 nm.

In another embodiment, 95% of the defects with a defect diameter from 50 nm to 800 nm have a defect diameter of less than 100 nm. In another embodiment, 95% of the defects with a defect diameter from 50 nm to 800 nm have a defect diameter of less than 80 nm.

The following examples are for illustrative purposes only and are not intended to limit the scope of the claims.

The effect of the disclosed oxyanions on the growth of ammonium sulfate defects on a quartz substrate is determined. In these experiments, the crystal growth of an evaporating solution of ammonium sulfate doped with varying concentrations of aluminum sulfate (aluminum oxyanion) is measured. The concentration of ammonium sulfate is held constant at $7.8 \times 10^{-5}$ M, and aluminum sulfate is added at relative concentrations of 0, 100, 1000 and 10,000 ppm. A 200 microliter drop of each solution is dropped onto a quartz disc and allowed to evaporate in a N2-purged environment. The resulting crystal size is determined by microscopy and the largest crystal defect is measured. The following table (Table 1) list the results of the experiments.

TABLE 1

The results of the crystal growth studies utilizing the oxyanions of the disclosure.

| Sample | Largest Measured Crystal (micrometers) |
| --- | --- |
| 0 ppm $Al_2(SO_4)_3$ | 700 |
| 100 ppm $Al_2(SO_4)_3$ | 700 |
| 1000 ppm $Al_2(SO_4)_3$ | 150 |
| 10,000 ppm $Al_2(SO_4)_3$ | 150 |

These results show that unexpectedly the growth of the ammonium sulfate crystals is substantially reduced by the presence of the disclosed oxyanions. Accordingly, the disclosed process for making a photomask leads to a photomask with smaller defects thus improving the quality of the photomask.

The effect of contacting a quartz substrate with a solution comprising anions selected from sulfate, hydrogen sulfate, sulfite, nitrate, nitrite, acetate, lactate, carbonate, hydrogen carbonate and any combination thereof, and cations selected from sodium, potassium, calcium, magnesium, aluminum nitrite or any combination thereof, is illustrated in the following example. Quartz specimens (1×1 inch) were dipped in aqueous solutions of aluminum lactate of variable concentration for 180 s and then dried under a current of dry nitrogen. Secondary Ion Mass Spectroscopy (SIMS) analysis was performed on the treated specimens. The surface concentration of aluminum ions is reported in Table 2. Increasing levels of purposely added impurities can be found for those specimens treated with increasing concentration of aluminum lactate.

TABLE 2

The results of surface concentration determination of purposely added ionic impurities utilizing the oxyanions of the disclosure.
Anion = $CH_3CH(OH)COO^-$

| | Quartz (*) | Chrome (*) |
| --- | --- | --- |
| No rinse | $1.0\ 10^{12}$ | $2.4\ 10^{11}$ |
| $H_2O$ Rinse | $2.7\ 10^{11}$ | $1.0\ 10^{12}$ |

TABLE 2-continued

The results of surface concentration determination of purposely added ionic impurities utilizing the oxyanions of the disclosure.
Anion = $CH_3CH(OH)COO^-$

| | Quartz (*) | Chrome (*) |
|---|---|---|
| $10^{-9}$ M $Al^{3+}$ | $5.2 \times 10^{11}$ | $1.0 \times 10^{11}$ |
| $10^{-8}$ M $Al^{3+}$ | $1.0 \times 10^{12}$ | $1.2 \times 10^{11}$ |
| $10^{-7}$ M $Al^{3+}$ | $7.2 \times 10^{12}$ | $5.7 \times 10^{11}$ |
| $10^{-6}$ M $Al^{3+}$ | $2.9 \times 10^{12}$ | $4.1 \times 10^{12}$ |
| $10^{-5}$ M $Al^{3+}$ | $6.9 \times 10^{12}$ | $2.0 \times 10^{12}$ |
| $10^{-4}$ M $Al^{3+}$ | $1.5 \times 10^{14}$ | $6.3 \times 10^{12}$ |
| $10^{-3}$ M $Al^{3+}$ | $1.1 \times 10^{14}$ | $6.3 \times 10^{12}$ |

(*) Surface $Al^{3+}$ in atoms/cm$^2$

The foregoing description illustrates and describes the present disclosure. Additionally, the disclosure shows and describes only the preferred embodiments of the disclosure, but, as mentioned above, it is to be understood that it is capable of changes or modifications within the scope of the concept as expressed herein, commensurate with the above teachings and/or skill or knowledge of the relevant art. The embodiments described hereinabove are further intended to explain best modes known of practicing the disclosure and to enable others skilled in the art to utilize the disclosure in such, or other, embodiments and with the various modification required by the particular applications or uses disclosed herein. Accordingly, the description is not intended to limit the disclosure to the form disclosed herein. Also, it is intended that the appended claims be construed to include alternative embodiments.

All publications, patents and patent applications cited in this specification are herein incorporated by reference, and for any and all purposes, as if each individual publication, patent or patent application were specifically and individually indicated to be incorporated by reference. In the case of inconsistencies, the present disclosure will prevail.

We claim:

1. A process for making a photomask for use in photolithography, the process comprising:
   providing a transparent substrate with a reflective film disposed over a surface of the transparent substrate;
   applying a photoresist to the reflective film, and forming a pattern in the photoresist that is transferred to the transparent substrate;
   developing the pattern on the transparent substrate by removing the remaining portions of the photoresist; and
   contacting a surface of the reflective film with a solution comprising oxyanions after the removing the remaining portions of the photoresist wherein the cations are selected from the group consisting of sodium, potassium, calcium, magnesium, and aluminum and any or a mixture thereof.

2. The process of claim 1, wherein the oxyanions are inorganic oxyanions selected from the group consisting of sulfate, hydrogen sulfate, sulfite, nitrate, nitrite, acetate, lactate, carbonate, and hydrogen carbonate or a mixture thereof.

3. The process of claim 1, wherein the solution is an aqueous solution comprising aluminum sulfate, aluminum lactate or a mixture thereof.

4. The process of claim 3 wherein the aluminum sulfate, aluminum lactate or a mixture thereof is present at a concentration from about 0.1 ppb to about 1 ppm.

5. The process of claim 3, wherein the aluminum sulfate, aluminum lactate or a mixture thereof is present at a total concentration from about 1 ppm to about 10000 ppm.

6. A process for making a photomask for use in photolithography, the process comprising:
   providing a transparent substrate with a reflective film disposed over a surface of the transparent substrate;
   applying a photoresist to the reflective film, and forming a pattern in the photoresist that is transferred to the transparent substrate;
   developing the pattern on the transparent substrate by removing the remaining portions of the photoresist; and
   contacting a surface of the reflective film with a solution comprising oxyanions after the removing the remaining portions of the photoresist, wherein the oxyanions comprise aluminum sulfate, aluminum lactate or a mixture thereof and the oxyanions are present at a concentration from about 0.1 ppb to about 1 ppm.

7. A process for making a photomask for use in photolithography, the process comprising:
   providing a transparent substrate with a reflective film disposed over a surface of the substrate;
   applying a photoresist to the reflective film, and forming a pattern in the photoresist that is transferred to the transparent substrate;
   developing the pattern on the transparent substrate by removing the remaining portions of the photoresist; and
   contacting a surface of the reflective film with a solution comprising oxyanions after the removing the remaining portions of the photoresist, wherein the oxyanions comprise aluminum sulfate, aluminum lactate or a mixture thereof and the oxyanions are present at a concentration from about 1 ppm to about 10000 ppm.

8. The process of claim 1, wherein the transparent substrate is a quartz substrate.

9. The process of claim 1, wherein the reflective film comprises chromium.

10. The process of claim 8, wherein the reflective film consists essentially of chromium oxide.

11. The process of claim 1, wherein the development of the pattern on the transparent substrate effected by removing portions of the photoresist comprises contacting the patterned photoresist with a solution prepared with sulfuric acid, followed by a rinse solution comprising ammonia.

12. A photomask produced according to the process of claim 1, comprising a patterned reflective film disposed on a surface of a transparent substrate such that light can be transmitted through transparent surface regions of the transparent substrate not in contact with the reflective film, wherein the transparent surface regions include dispersed defects of ammonium salts of which greater than 95% of the defects with a defect diameter from 50 nm to 800 nm have a defect diameter of less than 100 nm.

13. The photomask of claim 11, wherein the 95% of the defects with a defect diameter from 50 nm to 800 nm have a defect diameter of less than 80 nm.

* * * * *